(12) United States Patent
Yano et al.

(10) Patent No.: US 7,659,658 B2
(45) Date of Patent: Feb. 9, 2010

(54) WHITE PHOSPHOR, AND WHITE LIGHT-EMITTING EQUIPMENT OR DEVICE

(75) Inventors: Tomoyasu Yano, Ageo (JP); Asuka Sasakura, Ageo (JP); Jun-ichi Itoh, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 12/227,520

(22) PCT Filed: May 17, 2007

(86) PCT No.: PCT/JP2007/060564

§ 371 (c)(1),
(2), (4) Date: Nov. 19, 2008

(87) PCT Pub. No.: WO2007/136105

PCT Pub. Date: Nov. 29, 2007

(65) Prior Publication Data

US 2009/0108732 A1     Apr. 30, 2009

(30) Foreign Application Priority Data

May 19, 2006 (JP) ............................. 2006-139808
Apr. 24, 2007 (JP) ............................. 2007-113952

(51) Int. Cl.
*H01J 1/62* (2006.01)
*C09K 11/59* (2006.01)

(52) U.S. Cl. .................. 313/486; 313/485; 313/487; 313/501; 313/503; 313/512; 252/301.4 F; 257/99; 257/100

(58) Field of Classification Search ......... 313/484–487; 252/301.4 F; 257/99, 100
See application file for complete search history.

(56) References Cited

U.S. PATENT DOCUMENTS 7,227,190 B2 * 6/2007 Yasukawa et al. ............. 257/79
7,229,571 B2   6/2007 Ezuhara et al.
7,357,882 B2 * 4/2008 Seto et al. ............. 252/301.4 R (Continued)

FOREIGN PATENT DOCUMENTS

EP     1811009 A1     7/2007

(Continued)

OTHER PUBLICATIONS

Sun, Xiao-yuan et al., "A Single White Phosphor Suitable for New Ultraviolet Excitation Applied to New Generation White LED Lighting", Chinese Juornal of Luminescence (Jun. 2005), vol. 26, No. 3, pp. 404-406 (English Abstract appears at end of article).

*Primary Examiner*—Sikha Roy
(74) *Attorney, Agent, or Firm*—The Webb Law Firm

(57) ABSTRACT

A white phosphor is provided, which is a white phosphor comprising a single material, wherein the light-emitting center is one element other than Mn, and emitting white light having excellent color rendering properties by near ultraviolet excitation. The white phosphor is represented by the formula $Sr_aS_bMg_cZn_dSi_eO_f:Eu^{2+}$ (with the proviso that when $e=1$, $0<(c+d)/(a+c+d)\leq 0.2$, $1.8\leq a+c+d\leq 2.2$, $0\leq b/(b+f)\leq 0.07$ and $3.0\leq b+f\leq 4.4$), among which, as one preferred example, the white phosphor is represented by the composition formula $(SrO_{1-\alpha}S_\alpha)_x \cdot (Mg_{1-\beta}Zn_\beta O)_y \cdot (SiO_2)_z:Eu^{2+}$ (in the formula, $4.5\leq x/y\leq 27.5$, $3\leq z/y\leq 14.5$, $0\leq\alpha\leq 0.3$ and $0\leq\beta\leq 0.7$) is proposed.

12 Claims, 7 Drawing Sheets
(2 of 7 Drawing Sheet(s) Filed in Color)

U.S. PATENT DOCUMENTS

| | | |
|---|---|---|
| 7,462,983 B2 | 12/2008 | Baroky et al. |
| 2007/0158614 A1 | 7/2007 | Seto et al. |
| 2007/0247051 A1 | 10/2007 | Kuze et al. |

FOREIGN PATENT DOCUMENTS

| | | | |
|---|---|---|---|
| JP | 2002064220 A | * | 2/2002 |
| JP | 2003142004 A | | 5/2003 |
| JP | 2003306674 A | | 10/2003 |
| JP | 3503139 B2 | | 12/2003 |
| JP | 2005020010 A | | 1/2005 |
| JP | 2005226069 A | | 8/2005 |
| JP | 2006124644 A | | 5/2006 |

* cited by examiner

US 7,659,658 B2

WHITE PHOSPHOR, AND WHITE LIGHT-EMITTING EQUIPMENT OR DEVICE

TECHNICAL FIELD

The present invention relates to a white phosphor, which is a white phosphor comprising a single material that may emit white light by near ultraviolet excitation, as well as to a white light-emitting equipment or device using the same.

BACKGROUND ART

Fluorescent tubes and incandescent light bulbs are current mainstream light sources for illumination; however, compared to a fluorescent tube or the like, those using LEDs (light-emitting diodes) for light source have less electrical power consumption, longer life span, and are safe as they are not hot to the touch, moreover, since they do not contain harmful substances such as mercury and the like, they have excellent environmental aspects, such that they are anticipated to become a mainstream light source for illumination in the near future, and a variety of research and development are being undertaken.

White light can be achieved only when lights of a variety of colors (wavelengths) are mixed. The color of an LED light, since it depends on the difference (band gap) when a high energy electron drops to a low energy position and this band gap is specific to the semiconductor crystal used in an LED chip, is fundamentally a monochromatic light such as red, green and blue, and a white light cannot be obtained from only one LED.

As a method for obtaining white light using an LED, a method has been proposed, whereby an LED serving as a light emitter and phosphor are combined, light emitted from the LED is absorbed by the phosphor, the absorbed light is wavelength-converted by this phosphor into a light having a different wavelength, white light is obtained by diffused color mixing of the light emission from the LED and the light emission from the phosphor, or, by only the light emission that has been wavelength-converted by the phosphor.

For instance, a white light-emitting device is known, in which a light-emitting diode chip (GaN), which emits blue light, and a YAG series phosphor ($Y_3Al_5O_{12}$:Ce or the like), which emits light in yellow, are combined, a portion of the blue light radiated by the light-emitting diode chip (GaN) is left to be transmitted by the YAG series phosphor layer and the remainder is left to hit the YAG series phosphor and emit a yellow light, and these lights of two colors being color-mixed to create a pseudo-white light (refer to Patent Reference 1).

The white light-emitting device of such a constitution obtains pseudo-white light constituted by blue and yellow in terms of color components. Therefore, it has poor color rendering properties, that is to say, the property of the color of an object to be seen identically to when illuminated with natural light, and is said to be ill-suited of general illumination.

In Patent Reference 2, a light-emitting device comprising a blue LED, a green phosphor composition and a red phosphor composition is disclosed. This light-emitting device lets the light-emission (blue light) from the blue LED be received by each of the green phosphor composition and red phosphor composition, which respectively emit light with long wavelengths (green light and red light), to obtain white light by diffused color mixing of the blue light from the blue LED and the green light and red light from the phosphor compositions.

Since this light-emitting device uses a plurality of phosphors (compositions), color adjustment is difficult due to the interaction between the phosphors. In particular, as blending to adjust the contents in phosphors emitting light for each color, the mixing method and the like, is difficult, it bears the issue that variations occur in the quality of the product.

If white light could be achieved with a single phosphor, it would be useful since there would be no need to blend various phosphors, allowing the variations in the quality of the products to be suppressed. However, the few are known in prior art as white phosphors comprising a single material, the extent being that, for instance in Patent Reference 3, as a phosphor emitting red or white light by an excitation light in the near ultraviolet to visible region, a white light-emitting device is disclosed, which is a silicate of the $M_2SiO_4$ type containing Ba and Ca activated with Eu and Mn, allowing a white light-emitting to be obtained by controlling the molar ratio of Mn to a small positive value.

Patent Reference 1: JP Patent No. 3503139

Patent Reference 2: Japanese Patent Application Laid-open No. 2005-20010

Patent Reference 3: Japanese Patent Application Laid-open No. 2005-226069, in particular [0017]

DISCLOSURE OF THE INVENTION

Issues to be Addressed by the Invention

Since the white light-emitting device disclosed in the above Patent Reference 3 is one in which Eu and Mn serve as light-emitting centers (light-emitting ions) and the energy emitted by Eu is received by Mn to emit white light, it bears the issue that the light-emitting mechanism is complex and inefficient, and moreover, presents afterglow. In addition, with this white light-emitting device, the valence of Mn must be controlled to be divalent ($Mn^{2+}$), and since controlling the valence of Mn to be divalent is extremely difficult, the synthesis per se of the phosphor is not simple. From such points, the development of a white phosphor, which is a white phosphor comprising a single material, and furthermore, in which the light-emitting center comprises one element other than Mn is desired.

In addition, from the point of view of energy efficiency or the like, shortening of LED light-emission wavelength has been carried forward in recent years, and the development of phosphors that are excited by a light in the near ultraviolet region, which is on the shorter wavelength side than blue LED is sought.

Thus, the present invention provides a white phosphor, which is a white phosphor comprising a single material, which light-emitting center is one element other than Mn, and furthermore, which may emit white light having excellent color rendering properties by near ultraviolet excitation, as well as a white light-emitting equipment or device using the same.

SUMMARY OF THE INVENTION

The present invention proposes a white phosphor represented by the formula $Sr_aS_bMg_cZn_dSi_eO_f$:$Eu^{2+}$ (with the proviso that when e=1, $0<(c+d)/(a+c+d)\leq0.2$, $1.8\leq a+c+d\leq2.2$, $0\leq b/(b+f)\leq0.07$, $3.0\leq b+f\leq4.4$), in other words, a white phosphor represented by the composition formula $(SrO_{1-\alpha}S_\alpha)_x\cdot(Mg_{1-\beta}Zn_\beta O)_y\cdot(SiO_2)_z$:$Eu^{2+}$ (in the formula, $4.5\leq x/y\leq27.5$, $3\leq z/y\leq14.5$, $0\leq\alpha\leq0.3$, $0\leq\beta\leq0.7$).

Among this, a white phosphor represented by the formula $Sr_aS_bMg_cZn_dSi_eO_f$:$Eu^{2+}$ (with the proviso that when e=1, $0<(c+d)/(a+c+d)\leq0.2$, $1.8\leq a+c+d\leq2.2$, $0\leq b/(b+f)\leq0.05$, $3.5\leq b+f\leq4.2$), in other words, a white phosphor represented by the composition formula $(SrO_{1-\alpha}S_\alpha)_x\cdot(Mg_{1-\beta}Zn_\beta O)_y\cdot$ $(SiO_2)_z$:Eu$^{2+}$ (in the formula, $5 \leq x/y \leq 11$, $3 \leq z/y \leq 6$, $0 \leq \alpha \leq 0.1$, $0 \leq \beta \leq 0.5$) is proposed.

Since the white phosphor of the present invention is a white phosphor comprising a single material and does not require blending several species of phosphors, thus, preparation is simple, allowing products to be prepared stably with no variation in the quality of the product.

In addition, since the white phosphor of the present invention can emit white light having excellent color rendering properties by excitation with light at a wavelength of 250 nm to 480 nm, for instance by combination with a near ultraviolet LED (for instance 405 nm), allows a white light-emitting equipment or device to be constituted, which contains no harmful substance such as mercury, Se, Cd and the like, has low electrical power consumption, has a long life span, is safe, and has excellent color rendering properties.

In addition, since the light-emitting center (light-emitting ion) is Eu$^{2+}$ only, compared to the white light-emitting device of the above Patent Reference 3, the light-emitting mechanism is not complex, the efficiency is greater, and, moreover, there is no persistence. Furthermore, since controlling the valence of Eu is easier compared to Mn, not only there is the advantageous point that phosphor can be synthesized readily, but there is also the advantageous point that there is little color alteration accompanying an increase in temperature.

The white phosphor of the present invention, as well as the white light-emitting equipment or device using the same, can be used, in addition to general illumination, in special light source, backlight for liquid crystal and in display devices such as display equipment for EL, FED and CRT. Among these, since white light having excellent color rendering properties may be emitted, it is particularly suited as general illumination requiring white light close to natural light (sunlight).

Note that the white phosphor of the present invention may have any form, powder, or mold.

In addition, in the present invention, "light-emitting element" in "white light-emitting equipment or device" means a light-emitting device provided with at a least a phosphor and a light emission source as the excitation source thereof and emitting light at a comparatively small scale, and "light-emitting device" means a light-emitting device provided with at a least a phosphor and a light emission source as the excitation source thereof and emitting light at a comparatively large scale.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

BEST MODE FOR CARRYING OUT THE INVENTION

Figure 1:
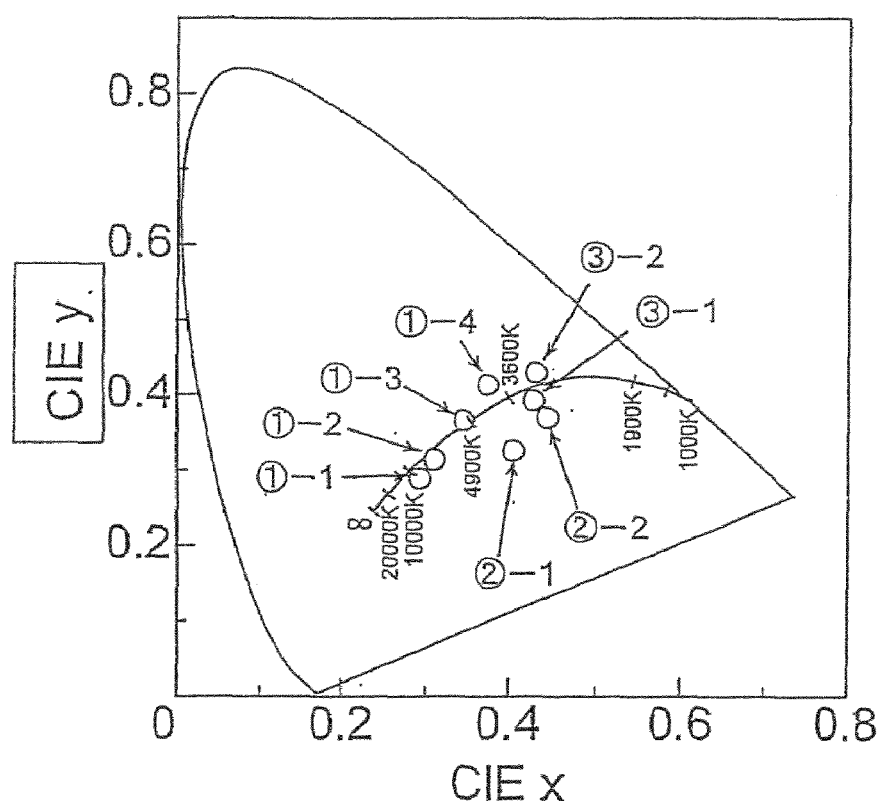
FIG. 1 is a graph showing the light emission colors of the phosphors obtained in the examples in the CIE chromaticity coordinate.
Figure 2:
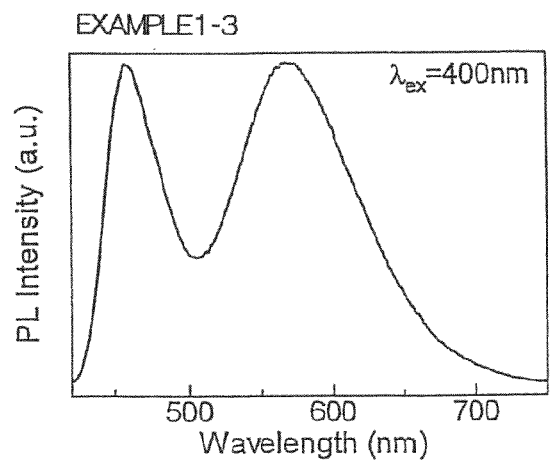
FIG. 2 is a PL spectrum of the phosphor obtained in Example 1-3 (excitation wavelength: 400 nm)
Figure 3:
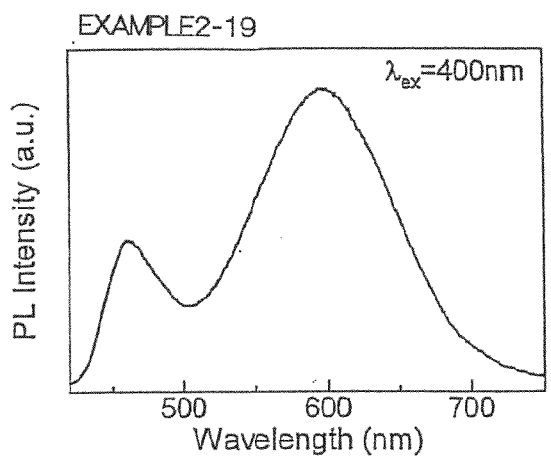
FIG. 3 is a PL spectrum of the phosphor obtained in Example 2-19 (excitation wavelength: 400 nm)
Figure 4:
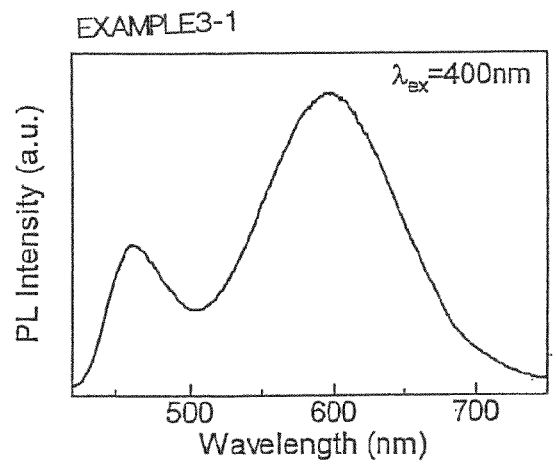
FIG. 4 is a PL spectrum of the phosphor obtained in Example 3-1 (excitation wavelength: 400 nm)
Figure 5:
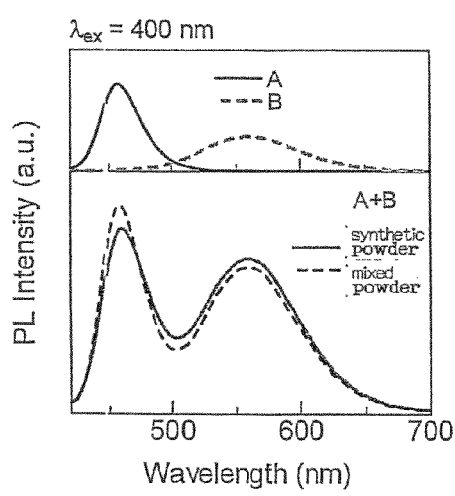
FIG. 5 is a PL spectrum of the phosphor obtained in Comparative Example 4 ("mixed powder" in the figure) and the phosphor obtained in Example 1-1 ("synthetic powder" in the figure)

Embodiments of the present invention will be described hereinafter in detail; however, the scope of the present invention is not limited to the embodiments described below.

In the present specification, when stating "X to Y" (X and Y are any numbers), unless otherwise mentioned, "X or greater and Y or less" is meant, including the meaning "preferably greater than X" or "preferably less than Y".

The white phosphor according to a first embodiment of the present invention (hereinafter referred to as "the present phosphor 1") is a white phosphor represented by the composition formula $(SrO)_x \cdot (MgO)_y \cdot (SiO_2)_z$:Eu$^{2+}$.

In this case, it is important that the molar ratio "x/y" between Sr and Mg is $4.5 \leq x/y \leq 27.5$. If $4.5 \leq x/y \leq 27.5$, white light consists of RGB, specifically, white light represented by the CIE chromaticity coordinates x=0.25 to 0.53 and y=0.25 to 0.50 (hereinafter referred to as "white light 1") can be obtained. From the point of view of obtaining the desirable white light, specifically, a white light represented by x=0.28 to 0.45 and y=0.25 to 0.43 in the CIE chromaticity coordinate (hereinafter referred to as "white light 2"), preferably $5 \leq x/y \leq 11$, particularly preferably $5.5 \leq x/y \leq 9$, among which particularly $6 \leq x/y \leq 8$, is preferred.

It is important that the molar ratio "z/y" between Si and Mg is $3 \leq z/y \leq 14.5$. If $3 \leq z/y \leq 14.5$, white light provided with RGB, specifically white light 1, can be obtained. From the point of view of obtaining the desirable white light, specifically white light 2, preferably $3 \leq z/y \leq 6$, particularly preferably $3.3 \leq z/y \leq 5.5$, among which particularly $3.5 \leq z/y \leq 5$, is preferred.

The present phosphor 1 is preferably a phosphor containing an $Sr_3MgSi_2O_8$ phase and an $Sr_2SiO_4$ phase.

The white phosphor according to a second embodiment of the present invention (hereinafter referred to as "the present phosphor 2") is a white phosphor represented by the composition formula $(SrO_{1-\alpha}S_\alpha)_x \cdot (MgO)_y \cdot (SiO_2)_z$:Eu$^{2+}$.

In this case, it is important that the molar ratio "x/y" between Sr and Mg is $4.5 \leq x/y \leq 27.5$. If $4.5 \leq x/y \leq 27.5$, white light provided with RGB, specifically white light 1, can be obtained. From the point of view of obtaining the desirable white light, specifically white light 2, preferably $5 \leq x/y \leq 11$, particularly preferably $5.5 \leq x/y \leq 9$, among which particularly $6 \leq x/y \leq 8$, is preferred.

It is important that the molar ratio "z/y" between Si and Mg is $3 \leq z/y \leq 14.5$. If $3 \leq z/y \leq 14.5$ white light provided with RGB, specifically white light 1 can be obtained. From the point of view of obtaining the desirable white light, specifically white light 2, preferably $3 \leq z/y \leq 6$, particularly preferably $3.3 \leq z/y \leq 5.5$, among which particularly $3.5 \leq z/y \leq 5$, is preferred.

In addition, it is important that "α" representing the concentration of S is $0 \leq \alpha \leq 0.3$. If $0 \leq \alpha \leq 0.3$, color adjustment providing a red component is possible within the range of a white light, and specifically white light 1. From the point of view of obtaining the desirable white light, specifically white light 2, preferably $0 \leq \alpha \leq 0.10$, particularly preferably $0.01 \leq \alpha \leq 0.08$, among which particularly $0.01 \leq \alpha \leq 0.06$, is preferred.

The present phosphor 2 is preferably a phosphor containing an $Sr_3MgSi_2O_8$ phase, an $Sr_2SiO_4$ phase and an SrS phase.

The white phosphor according to a third embodiment of the present invention (hereinafter "the present phosphor 3") is a white phosphor represented by the composition formula $(SrO_{1-\alpha}S_\alpha)_x \cdot (Mg_{1-\beta}Zn_\beta O)_y \cdot (SiO_2)_z : Eu^{2+}$.

In this case, it is important that the molar ratio "x/y" between Sr and $Mg_{1-\beta}Zn_\beta$ is $4.5 \leq x/y \leq 27.5$. If $4.5 \leq x/y \leq 27.5$, white light provided with RGB, specifically white light 1 can be obtained. From the point of view of obtaining the desirable white light, specifically white light 2, preferably $5 \leq x/y \leq 11$, particularly preferably $5.5 \leq x/y \leq 9$, among which particularly $6 \leq x/y \leq 8$, is preferred.

It is important that the molar ratio "z/y" between Si and $Mg_{1-\beta}Zn_\beta$ is $3 \leq z/y \leq 14.5$. If $3 \leq z/y \leq 14.5$, white light provided with RGB, specifically white light 1, can be obtained. From the point of view of obtaining the desirable white light, specifically white light 2, preferably $3 \leq z/y \leq 6$, particularly preferably $3.3 \leq z/y \leq 5.5$, among which particularly $3.5 \leq z/y \leq 5$, is preferred.

It is important that "a" representing the concentration of S is $0 \leq \alpha \leq 0.3$. If $0 \leq \alpha \leq 0.3$, color adjustment providing a red component is possible within the range of a white light, and specifically white light 1. From the point of view of obtaining the desirable white light, specifically white light 2, preferably $0 \leq \alpha \leq 0.1$, particularly preferably $0.01 \leq \alpha \leq 0.08$, among which particularly $0.01 \leq \alpha \leq 0.06$, is preferred.

In addition, it is important that "β" representing the concentration of Zn is $0 \leq \beta \leq 0.7$. If $0 \leq \beta \leq 0.7$, color adjustment providing a green component is possible within the range of a white light, and specifically white light 1. From the point of view of obtaining the desirable white light, specifically white light 2, preferably $0 \leq \beta \leq 0.5$, particularly preferably $0 < \beta \leq 0.45$, among which particularly $0 \leq \beta \leq 0.3$, is preferred.

The present phosphor 3 is preferably a phosphor containing an $Sr_3MgSi_2O_8$ phase, an $Sr_2SiO_4$ phase, an SrS phase and an $Sr_2ZnSi_2O_7$ phase.

Note that whether or not a phosphor is a phosphor represented by the composition formulae of the present phosphors 1 to 3 can be determined by measuring the quantity of each element using an X-ray fluorescence analyzer (XRF), or, by totally dissolving with hydrofluoric acid or the like and using an ICP spectrophotometer or the like.

Any of the above present phosphors 1 to 3 (collectively referred to as "the present invention phosphors") can be represented by the composition formula $Sr_aS_bMg_cZn_dSi_eO_f : Eu^{2+}$.

In such composition formula, when e=1 (idem hereinafter), it is important that $(c+d)/(a+c+d)$ is $0 < (c+d)/(a+c+d) \leq 0.2$, and from the point of view of obtaining the desirable white light, specifically white light 2, preferably $0.05 \leq (c+d)/(a+c+d) \leq 0.18$ and particularly preferably $0.08 \leq (c+d)/(a+c+d) \leq 0.17$.

In addition, it is also important that a+c+d is $1.8 \leq a+c+d \leq 2.2$, and from the point of view of obtaining the desirable white light, specifically white light 2, preferably $1.9 \leq a+c+d \leq 2.2$, and particularly preferably $1.9 \leq a+c+d \leq 2.1$.

In addition, it is also important that b/(b+f) is $0 \leq b/(b+f) \leq 0.07$, and from the point of view of obtaining the desirable white light, specifically white light 2, preferably $0 \leq b/(b+f) \leq 0.05$, particularly preferably $0 \leq b/(b+f) \leq 0.04$, among which particularly $0 \leq b/(b+f) \leq 0.03$, is preferred.

In addition, it is also important that b+f is $3.0 \leq b+f \leq 4.4$, and from the point of view of obtaining the desirable white light, specifically white light 2, preferably $3.5 \leq b+f \leq 4.2$, particularly preferably $3.8 \leq b+f \leq 4.2$, among which particularly $3.9 \leq b+f \leq 4.1$, is preferred.

Note that whether or not a phosphor is a phosphor represented by the above composition formula: $Sr_aS_bMg_cZn_dSi_eO_f : Eu^{2+}$ can be determined by measuring the quantity of each element using an X-ray fluorescence analyzer (XRF), or, by totally dissolving with hydrofluoric acid or the like and using an ICP spectrophotometer or the like.

It is important that the light-emitting center (light-emitting ion) of the present invention phosphor is a divalent $Eu^{2+}$, preferably a divalent $Eu^{2+}$ only.

If trivalent ($Eu^{3+}$), only a characteristic red light emission with a sharp emission line and no desirable white light can be obtained.

Although the light-emission wavelength (color) of $Eu^{2+}$ is known to dependent strongly on the host material and to display diverse wavelengths depending on the host material, if the host material is specified by the present invention phosphor, an emission spectrum displaying white can be obtained.

It is important that the concentration of $Eu^{2+}$ is 0.1 to 5 mol % of the concentration of Sr in the host material, and particularly 0.3 to 1 mol % is preferred.

In the present invention phosphor, a portion of Sr may be substituted by either or both of Ca and Ba. By substituting a portion of Sr with either or both of Ca and Ba, the color can be adjusted in the white light, allowing the color rendering properties to be increased.

In this case, the amount of Sr substitution of Ca and/or Ba can be to 60 mol % or less with respect to Sr, if in this range, the desired white light can be obtained.

(Properties)

The present invention phosphor is provided with the properties of being excited by a light at a wavelength of 250 nm to 480 nm and emitting white light, specifically white light 1, and preferably white light 2.

In regard to emission spectrum, the present invention phosphor can be said to be provided with the properties of having light-emission peaks at least in the 460 nm±30 nm and 580 nm±30 nm wavelength regions, by light excitation at a wavelength of 400 nm.

The present invention phosphor, as mentioned above, can emit white light1, that is to say, white light represented by x=0.25 to 0.53 and y=0.25 to 0.50 in the CIE chromaticity coordinate. In addition, it can be also prepared to emit white light 2, that is to say, white light represented by x=0.28 to 0.45, y=0.25 to 0.43 in the CIE chromaticity coordinate.

(Preparation Method)

Hereinafter, one example of preferred preparation method for the present invention phosphor will be described. However there is no limitation to the preparation method described below.

The present invention phosphor can be prepared by weighing respectively an SrO raw material, an MgO raw material, an $SiO_2$ raw material, an $Eu^{2+}$ raw material, as necessary, an S raw material and a Zn raw material, mixing the raw materials, firing in a reducing atmosphere at 1000 to 1400° C., and, as necessary, classifying.

As the SrO raw material, in addition to an oxide of Sr, a multiple oxide, a carbonate, and the like, can be cited.

As an MgO raw material, in addition to an oxide of Mg, a multiple oxide, a carbonate, and the like, can be cited.

As an SiO$_2$ raw material, in addition to silicon dioxide (SiO$_2$), compounds containing both Si and O can be cited. In addition, colloidal silica dispersed in an aqueous solvent can be also used.

As an S raw material, in addition to SrS, S (sulfur), H$_2$S gas, and the like, can be cited.

As a Zn raw material, in addition to an oxide of Zn, a multiple oxide, a carbonate, and the like, can be cited.

As described above, when substituting the portion of Sr, with either or both of Ca and Ba, it suffices to mix and fire Ca raw material and Ba raw material together with an SrO raw material, or the like.

In so doing, as Ca raw material and Ba raw material, in addition to an oxide of Ca or Ba, a multiple oxide, a carbonate, and the like, can be cited.

As Eu raw material, europium compounds (Eu salts) such as EuF$_3$, Eu$_2$O$_3$ and EuCl$_3$ can be cited.

In order to improve color rendering properties, rare earth elements such as Pr and Sm may be added to the raw materials, as color adjusters.

In order to improve excitation efficiency, one or more species of elements selected from the aluminum family of elements, such as Al and Ga, may be added to the raw materials, as sensitizers.

Similarly, in order to improve excitation efficiency, one or more species of elements selected from the rare earth family of elements, such as Sc, Y, La, Gd and Lu, may be added to the raw materials, as sensitizers.

The addition quantity of the above is preferably 5 mol % each or less. If the contents in these elements exceed 5 mol %, there is the risk that impurity phase yields in large amounts, decreasing the brightness noticeably.

In addition, an alkaline metal element, a monovalent cationic metal such as Ag$^+$, a halogen ion such as Cl$^-$, F$^-$ or I$^-$, may be added to the raw materials, as an electric charge compensator. From the points of electric charge compensation effect and brightness, the addition quantity thereof is preferably on the order of an amount that is equivalent to the content in aluminum family or rare earth family.

Mixing of raw materials may be carried out by a dry mixing or a wet mixing.

When mixing with the dry method, without particularly limiting this mixing method, for instance using zirconia ball for the media, mixing with a paint shaker, ball mill or the like, and, as necessary, drying to obtain a raw material mixture is sufficient.

When mixing with the wet method, bringing the raw materials in a suspended state, mixing with a paint shaker or a ball mill or the like similarly to above using zirconia ball for the media, then, separating the media with a sieve or the like, eliminating moisture from the suspension by an appropriate drying method such as reduced pressure drying and vacuum drying to obtain a dry raw material mixture is sufficient.

Prior to firing, the raw material mixture obtained as described above may be subjected to powderizing, classifying and drying, as necessary. However, powderizing, classifying and drying need not be carried out absolutely.

It is sufficient that firing is conducted at 1000 to 1400° C.

The firing atmosphere in this case is preferably adjusted to a reducing atmosphere, and in particular, a weakly reducing atmosphere, such as a nitrogen gas atmosphere containing a small amount of hydrogen gas, or, a carbon dioxide atmosphere containing carbon monoxide. Even if the Eu raw material contains a trivalent Eu, by firing in a reducing atmosphere, in particular, a weakly reducing atmosphere, the trivalent Eu is reduced into a divalent Eu through the firing process, allowing valence-conversion of into divalent.

Note that, prior to the above firing, provisional firing may be carried out.

In so doing, it is sufficient that provisional firing conducts for instance a mix powder at 800° C. to 1100° C., for one hour to 12 hours, in an atmosphere containing air, oxygen, Ar or hydrogen gas.

If the provisional firing temperature is less than 800° C., when carbonate is used in the raw materials, or the like, decomposition of carbon dioxide is insufficient, and in addition, when halide is used, a sufficient flux effect is not obtained. Meanwhile, at a high temperature exceeding 1100° C., abnormal grain growth occurs, such that obtaining homogeneous microparticles become difficult. In addition, if the provisional firing time is less than one hour, reproducibility in substance properties is difficult, and if 12 hours is exceeded, the problem of variation in the composition occurs due to an increase in evaporation substance.

After provisional firing, the powder may be powderized and mixed so that it becomes more homogeneous in its entirety, and then fired.

Although the present invention phosphor, as described above, is preferably a phosphor comprising an Sr$_3$MgSi$_2$O$_8$ phase and an Sr$_2$SiO$_4$ phase, also a SrS phase and further a Sr$_2$ZnSi$_2$O$_7$ phase, preparation of a white phosphor is believed to be possible by combining a host material phase indicated below or a luminescence center.

That is to say, as oxides, IIa$_3$MgSi$_2$O$_8$, IIaMgAl$_{10}$O$_7$, IIa$_2$SiO$_4$, IIa$_3$SiO$_5$, ZnGa$_2$O$_4$, IIaAl$_2$O$_4$, Y$_3$Al$_5$O$_{12}$ (garnet series), M$_2$SiO$_5$, M$_2$O$_3$, IIaTiO$_3$, IIaZrO$_3$ (provskite series), and the like, may be cited.

As nitrides, M$_{1-X}$IIb$_X$Al(Si$_{6-Z}$Al$_Z$)N$_{10-Z}$O$_Z$, IIaSi$_2$O$_2$N$_2$, for instance, sialon series such as IIaSi$_{10-X}$Al$_{18+n}$O$_n$N$_{32-n}$, IIaAlSiN$_3$, IIa$_2$Si$_5$N$_8$, and the like, may be cited.

As sulfides, IIa$_2$SiS$_4$, IIaGa$_2$S$_4$, IIaAl$_2$S$_4$, (IIa$_{1-X}$IIIb$_X$)S, (IIb$_{1-X}$)S, IIa$_2$ZnS$_3$, M$_2$O$_2$S, and the like, may be cited.

As luminescence centers, Ce, Tb, Pr, Sm, Cu, Ag, Au, and the like, may be cited, in addition to Eu.

With the proviso that, IIa above is a combination of one species or two or more species chosen from the group comprising Mg, Ca, Sr and Ba.

IIb is Zn or Cd, or a combination of both.

IIIb is a combination of one species or two or more species chosen from the group comprising Al, Ga and In.

M is a combination of one species or two or more species chosen from the group comprising Sc, Y, La, Gd and Lu.

(Application)

Although the present invention phosphor can be used alone as a fluorescent ink or the like in forgery prevention printing applications, by combination with a light emitter that may excite the present invention phosphor, a white light-emitting equipment or device can be constructed, and used in various applications. For instance, in addition to general illumination, special light source, backlight for liquid crystal, display devices such as display equipments for EL, FED, CRT, and the like. In particular, since white light with excellent color rendering properties is emitted, it is particularly suited for general illumination applications.

As one example of white light-emitting equipment or device combining the present invention phosphor and a light emitter that may excite this, construction is possible by placing the present white phosphor in the vicinity of a light emitter generating light at wavelengths of 250 nm to 480 nm, that is to say at a position where the light emitted by the light emitter may be received. Concretely, it suffices to overlay a phosphor layer comprising the present invention phosphor on top of the light emitter layer comprising the light emitter.

In so doing, it suffices to form the phosphor layer, for instance, adding the present invention phosphor in powder form together with a bonding agent to an appropriate solvent, mixing thoroughly to disperse homogeneously, applying the obtained coating solution on the surface of the light-emitting layer and drying to form a coat (phosphor layer) is sufficient.

In addition, it is also possible to form a phosphor layer by mixing the present invention phosphor into a glass composition to disperse the present invention phosphor within the glass layer.

Further in addition, the present invention phosphor may be formed into a sheet form and overlay this sheet on top of the light emitter layer, and in addition, the present invention phosphor may be directly sputtered over the light emitter layer to form a layer.

EXAMPLES

Hereinafter, the present invention will be described based on examples and comparative examples. However, the present invention is not to be interpreted limiting to these.

<Measurement of PL Emission Spectra>

PL (photoluminescence) spectra were measured using a spectrofluorometer (manufactured by Hitachi High-Technologies Corporation, F-4500).

<Measurement of CIE Chromaticity Coordinates>

Luminance and emission color (CIE chromaticity coordinate x and y values) were measured from the PL spectra using the following formula.

Math. 1

Method for converting CIE (Commission Internationale de l'Eclairage) chromaticity coordinate values If the light emission waveform of the sample is $P(\lambda)$ $$X = K \int_{380}^{780} P(\lambda)\bar{x}(\lambda)d\lambda$$
$$Y = K \int_{380}^{780} P(\lambda)\bar{y}(\lambda)d\lambda \quad (1)$$
$$Z = K \int_{380}^{780} P(\lambda)\bar{z}(\lambda)d\lambda$$

$$\text{where, } K = \frac{1}{\int_{380}^{780} P(\lambda)\bar{y}(\lambda)d\lambda}$$

The chromaticity coordinate values x and y are calculated from (1)

$$x = \frac{X}{X+Y+Z} \quad (2)$$
$$y = \frac{Y}{X+Y+Z}$$

However, x bar ($\lambda$), y bar ($\lambda$) and z bar ($\lambda$) are CIE spectral tristimulus values at 2° or 10° field of view, and the spectral tristimulus values at 2° field of view was used in the present specification.

Reference: Phosphor Handbook, Phosphor Research Society of Japan Ed., Ohm.

<X-Ray Fluorescence Analysis (XRF)>

The content in each element was measured using the calibration curve method using an X-ray fluorescence analyzer (manufactured by SII, Model SPS4000).

<ICP Spectrometry>

After total dissolution with hydrofluoric acid or the like, the content in each element was measured using the calibration curve method using an ICP spectrophotometer (manufactured by RIGAKU Corp., RIX3000).

Example 1-1 to 1-16, Comparative Example 1-1 to 1-2

As raw materials for host material, $SrCO_3$, MgO and $SiO_2$ were weighed as indicated in Table 1, at the same time, $EuF_3$ as raw material for activator was weighed to be 0.43 mol % with respect to the previous Sr, and this $EuF_3$ together with the previous raw materials for host material was mixed with a paint shaker for 90 minutes using φ3 mm zirconia ball for the media.

Next, the mixed powder and the media were separated with a 100 μm sieve, and a phosphor was obtained by firing at 1300° C. for six hours in a reducing gas atmosphere constituted by nitrogen and hydrogen.

TABLE 1

|  | $SrCO_3$ | MgO | $SiO_2$ |
|---|---|---|---|
| Example 1-1 | 250 | 50 | 150 |
| Example 1-2 | 240 | 40 | 140 |
| Example 1-3 | 230 | 30 | 130 |
| Example 1-4 | 220 | 20 | 120 |
| Example 1-5 | 210 | 10 | 110 |
| Example 1-6 | 250 | 50 | 150 |
| Example 1-7 | 235 | 35 | 135 |
| Example 1-8 | 237 | 37 | 137 |
| Example 1-9 | 230 | 30 | 130 |
| Example 1-10 | 225 | 25 | 125 |
| Example 1-11 | 220 | 20 | 120 |
| Example 1-12 | 218 | 18 | 118 |
| Example 1-13 | 216 | 16 | 116 |
| Example 1-14 | 214 | 14 | 114 |
| Example 1-15 | 212 | 12 | 112 |
| Example 1-16 | 210 | 10 | 110 |
| Comparative Example 1-1 | 210 | 70 | 170 |
| Comparative Example 1-2 | 255 | 55 | 150 |

The unit is mol.

Eu concentration was 0.5 mol % with respect to the concentration of Sr

As a result from the identification of phase formation by the X-ray diffractometer (XRD), X-ray fluorescence analysis (XRF) and ICP spectrophotometry, the obtained phosphor was shown to be a phosphor comprising an $Sr_3MgSi_2O_8$ phase and an $Sr_2SiO_4$ phase, and represented by the formulae $(SrO)_x \cdot (MgO)_y \cdot (SiO_2)_z : Eu^{2+}$ and $Sr_aMg_cSi_eO_f : Eu^{2+}$ as shown in Table 2.

TABLE 2

| | $(SrO_{1-\alpha}S_\alpha)x$—$(Mg_{1-\beta}Zn_\beta O)y$—$(SiO_2)z:Eu^{2+}$ | | | | $Sr_aS_bMg_cZn_dSi_eO_f:Eu^{2+}$ (range when e = 1) | | | | | |
|---|---|---|---|---|---|---|---|---|---|---|
| | x/y | z/y | α | β | (c + d)/(a + c + d) | a + c + d | b/(b + f) | b + f | CIEx | CIEy |
| Example 1-1 | 5.00 | 3.00 | 0 | 0 | 0.167 | 2.000 | 0 | 4.000 | 0.294 | 0.287 |
| Example 1-2 | 6.00 | 3.50 | 0 | 0 | 0.143 | 2.000 | 0 | 4.000 | 0.311 | 0.312 |
| Example 1-3 | 7.67 | 4.33 | 0 | 0 | 0.115 | 2.000 | 0 | 4.000 | 0.346 | 0.364 |
| Example 1-4 | 11.00 | 6.00 | 0 | 0 | 0.083 | 2.000 | 0 | 4.000 | 0.375 | 0.412 |
| Example 1-5 | 21.00 | 11.00 | 0 | 0 | 0.045 | 2.000 | 0 | 4.000 | 0.403 | 0.450 |
| Example 1-6 | 5.00 | 3.00 | 0 | 0 | 0.111 | 2.000 | 0 | 4.000 | 0.263 | 0.264 |
| Example 1-7 | 6.71 | 3.86 | 0 | 0 | 0.096 | 2.000 | 0 | 4.000 | 0.273 | 0.276 |
| Example 1-8 | 6.48 | 3.74 | 0 | 0 | 0.098 | 2.000 | 0 | 4.000 | 0.279 | 0.289 |
| Example 1-9 | 7.67 | 4.33 | 0 | 0 | 0.089 | 2.000 | 0 | 4.000 | 0.296 | 0.317 |
| Example 1-10 | 9.00 | 5.00 | 0 | 0 | 0.080 | 2.000 | 0 | 4.000 | 0.309 | 0.339 |
| Example 1-11 | 11.00 | 6.00 | 0 | 0 | 0.069 | 2.000 | 0 | 4.000 | 0.335 | 0.381 |
| Example 1-12 | 12.11 | 6.56 | 0 | 0 | 0.065 | 2.000 | 0 | 4.000 | 0.341 | 0.388 |
| Example 1-13 | 13.50 | 7.25 | 0 | 0 | 0.059 | 2.000 | 0 | 4.000 | 0.342 | 0.392 |
| Example 1-14 | 15.29 | 8.14 | 0 | 0 | 0.054 | 2.000 | 0 | 4.000 | 0.358 | 0.417 |
| Example 1-15 | 17.67 | 9.33 | 0 | 0 | 0.048 | 2.000 | 0 | 4.000 | 0.363 | 0.425 |
| Example 1-16 | 21.00 | 11.00 | 0 | 0 | 0.041 | 2.000 | 0 | 4.000 | 0.375 | 0.446 |
| Comparative Example 1-1 | 3.00 | 2.43 | 0 | 0 | 0.206 | 2.000 | 0 | 4.000 | 0.241 | 0.192 |
| Comparative Example 1-2 | 4.64 | 2.73 | 0 | 0 | 0.118 | 2.067 | 0 | 4.133 | 0.250 | 0.253 |

Examples 2-1 to 2-18, Comparative Example 2-1

As raw materials for host material, $SrCO_3$, MgO, $SiO_2$ and SrS were weighed as indicated in Table 3, at the same time, $EuF_3$ as raw material for activator was weighed to be 0.45 mol % with respect to the previous Sr, and this $EuF_3$ together with the previous raw materials for host material was mixed with a paint shaker for 90 minutes using φ3 mm zirconia ball for the media.

Next, the mixed powder and the media were separated with a 100 μm sieve, and a phosphor was obtained by firing at 1300° C. for six hours in a reducing gas atmosphere constituted by nitrogen and hydrogen.

TABLE 3

| | $SrCO_3$ | MgO | $SiO_2$ | SrS |
|---|---|---|---|---|
| Example 2-1 | 210 | 40 | 130 | 10 |
| Example 2-2 | 200 | 30 | 120 | 10 |
| Example 2-3 | 233 | 39 | 137 | 2 |
| Example 2-4 | 226 | 38 | 134 | 4 |
| Example 2-5 | 226 | 35 | 132 | 3 |
| Example 2-6 | 206 | 36 | 126 | 10 |
| Example 2-7 | 189 | 34 | 119 | 15 |
| Example 2-8 | 214 | 29 | 124 | 5 |
| Example 2-9 | 193 | 23 | 113 | 10 |

TABLE 3-continued

| | $SrCO_3$ | MgO | $SiO_2$ | SrS |
|---|---|---|---|---|
| Example 2-10 | 206 | 12 | 110 | 2 |
| Example 2-11 | 200 | 12 | 108 | 4 |
| Example 2-12 | 181 | 11 | 101 | 10 |
| Example 2-13 | 153 | 13 | 93 | 20 |
| Example 2-14 | 172 | 17 | 102 | 15 |
| Example 2-15 | 148 | 8 | 88 | 20 |
| Example 2-16 | 146 | 6 | 86 | 20 |
| Example 2-17 | 133 | 8 | 83 | 25 |
| Example 2-18 | 117 | 7 | 77 | 30 |
| Comparative Example 2-1 | 85 | 5 | 65 | 40 |

The unit is mol.

Eu concentration was 0.5 mol % with respect to the concentration of Sr

As a result from the identification of formation phases by the X-ray diffractometer (XRD), X-ray fluorescence analysis (XRF) and ICP spectrophotometry, the obtained phosphor was shown to be a phosphor comprising an $Sr_3MgSi_2O_8$ phase, an $Sr_2SiO_4$ phase and an SrS phase, and represented by the formulae $(SrO_{1-\alpha}S_\alpha)_x \cdot (MgO)_y \cdot (SiO_2)_z:Eu^{2+}$ and $Sr_aS_bMg_cSi_eO_f:Eu^{2+}$ as shown in Table 4.

TABLE 4

| | $(SrO_{1-\alpha}S_\alpha)x$—$(Mg_{1-\beta}Zn_\beta O)y$—$(SiO_2)z:Eu^{2+}$ | | | | $Sr_aS_bMg_cZn_dSi_eO_f:Eu^{2+}$ (range when e = 1) | | | | | |
|---|---|---|---|---|---|---|---|---|---|---|
| | x/y | z/y | α | β | (c + d)/(a + c + d) | a + c + d | b/(b + f) | b + f | CIEx | CIEy |
| Example 2-1 | 5.50 | 3.25 | 0.10 | 0 | 0.148 | 2.077 | 0.019 | 4.077 | 0.406 | 0.324 |
| Example 2-2 | 7.00 | 9.33 | 0.01 | 0 | 0.120 | 2.083 | 0.020 | 4.083 | 0.445 | 0.368 |
| Example 2-3 | 6.00 | 3.74 | 0.01 | 0 | 0.104 | 2.000 | 0.005 | 4.015 | 0.272 | 0.259 |
| Example 2-4 | 6.00 | 3.50 | 0.02 | 0 | 0.106 | 2.000 | 0.010 | 4.030 | 0.280 | 0.258 |
| Example 2-5 | 6.48 | 9.33 | 0.02 | 0 | 0.101 | 2.000 | 0.007 | 4.023 | 0.290 | 0.279 |
| Example 2-6 | 6.00 | 4.23 | 0.02 | 0 | 0.113 | 2.000 | 0.025 | 4.079 | 0.313 | 0.280 |
| Example 2-7 | 6.00 | 3.25 | 0.043 | 0 | 0.120 | 2.000 | 0.036 | 4.126 | 0.330 | 0.280 |
| Example 2-8 | 7.45 | 4.00 | 0.045 | 0 | 0.095 | 2.000 | 0.012 | 4.040 | 0.321 | 0.314 |
| Example 2-9 | 8.69 | 3.50 | 0.05 | 0 | 0.091 | 2.000 | 0.024 | 4.088 | 0.357 | 0.336 |
| Example 2-10 | 17.67 | 4.85 | 0.05 | 0 | 0.049 | 2.000 | 0.005 | 4.018 | 0.376 | 0.424 |
| Example 2-11 | 17.67 | 9.33 | 0.05 | 0 | 0.050 | 2.000 | 0.010 | 4.037 | 0.381 | 0.419 |

TABLE 4-continued

| | ($SrO_{1-\alpha}S_\alpha$)$x$—($Mg_{1-\beta}Zn_\beta O$)$y$—($SiO_2$)$z$:$Eu^{2+}$ | | | | $Sr_aS_bMg_cZn_dSi_eO_f$:$Eu^{2+}$ (range when e = 1) | | | | | |
|---|---|---|---|---|---|---|---|---|---|---|
| | x/y | z/y | α | β | (c + d)/(a + c + d) | a + c + d | b/(b + f) | b + f | CIEx | CIEy |
| Example 2-12 | 17.67 | 3.50 | 0.07 | 0 | 0.053 | 2.000 | 0.024 | 4.099 | 0.402 | 0.409 |
| Example 2-13 | 12.93 | 6.00 | 0.08 | 0 | 0.077 | 2.000 | 0.047 | 4.214 | 0.421 | 0.386 |
| Example 2-14 | 11.00 | 6.97 | 0.12 | 0 | 0.082 | 2.000 | 0.036 | 4.147 | 0.394 | 0.369 |
| Example 2-15 | 20.65 | 10.82 | 0.12 | 0 | 0.052 | 2.000 | 0.047 | 4.227 | 0.442 | 0.418 |
| Example 2-16 | 27.49 | 14.25 | 0.12 | 0 | 0.041 | 2.000 | 0.047 | 4.232 | 0.450 | 0.441 |
| Example 2-17 | 20.64 | 10.82 | 0.16 | 0 | 0.056 | 2.000 | 0.058 | 4.303 | 0.448 | 0.422 |
| Example 2-18 | 20.65 | 10.82 | 0.20 | 0 | 0.060 | 2.000 | 0.068 | 4.389 | 0.464 | 0.412 |
| Comparative Example 2-1 | 27.49 | 14.25 | 0.32 | 0 | 0.054 | 2.000 | 0.087 | 4.620 | 0.494 | 0.420 |

Examples 2-19 to 2-24, Comparative Examples 2-2 to 2-3

As raw materials for host material, $SrCO_3$, MgO, $SiO_2$, SrS, $BaCO_3$ and $CaCO_3$ were weighed as indicated in Table 5, at the same time, $EuF_3$ as raw material for activator was weighed to be 0.45 mol % with respect to the previous Sr, and this $EuF_3$ together with the previous raw materials for host material was mixed with a paint shaker for 90 minutes using φ3 mm zirconia ball for the media.

Next, the mixed powder and the media were separated with a 100 μm sieve, and a phosphor was obtained by firing at 1300° C. for six hours in a reducing gas atmosphere constituted by nitrogen and hydrogen.

TABLE 5

| | $SrCO_3$ | MgO | $SiO_2$ | SrS | $BaCO_3$ | $CaCO_3$ |
|---|---|---|---|---|---|---|
| Example 2-19 | 192 | 40 | 140 | 0 | 24 | 24 |
| Example 2-20 | 189 | 39 | 138 | 1 | 23.6 | 23.6 |
| Example 2-21 | 179 | 35 | 130 | 5 | 22.4 | 22.4 |
| Example 2-22 | 168 | 30 | 120 | 10 | 21 | 21 |
| Example 2-23 | 144 | 40 | 140 | 0 | 72 | 24 |
| Example 2-24 | 96 | 40 | 140 | 0 | 72 | 72 |
| Comparative Example 2-2 | 155 | 25 | 110 | 15 | 19.4 | 19.4 |
| Comparative Example 2-3 | 144 | 25 | 100 | 20 | 18 | 18 |

The unit is mol.

Eu concentration was 0.5 mol % with respect to the concentration of M (=SrCaBa)

As a result from the identification of formation phases by the X-ray diffractometer (XRD), X-ray fluorescence analysis (XRF) and ICP spectrophotometry, the obtained phosphor was shown to be a phosphor comprising an $M_3MgSi_2O_8$ phase, an $M_2SiO_4$ phase and an SrS phase, and represented by the formulae $(MO_{1-\alpha}S_\alpha)_x \cdot (MgO)_y \cdot (SiO_2)_z$:$Eu^{2+}$ and $M_aS_b\text{-}Mg_cSi_eO_f$:$Eu^{2+}$ as shown in Table 6. However, M is a portion of Sr that has been substituted by Ba and Ca.

TABLE 6

| | ($MO_{1-\alpha}S_\alpha$)$x$—($Mg_{1-\beta}Zn_\beta O$)$y$—($SiO_2$)$z$:$Eu^{2+}$ | | | | $M_aS_bMg_cZn_dSi_eO_f$:$Eu^{2+}$ (range when e = 1) | | | | | |
|---|---|---|---|---|---|---|---|---|---|---|
| | x/y | z/y | α | β | (c + d)/(a + c + d) | a + c + d | b/(b + f) | b + f | CIEx | CIEy |
| Example 2-19 | 6.00 | 3.50 | 0 | 0 | 0.143 | 2.000 | 0 | 4.000 | 0.356 | 0.423 |
| Example 2-20 | 6.00 | 3.50 | 0 | 0 | 0.141 | 2.007 | 0.002 | 4.007 | 0.365 | 0.418 |
| Example 2-21 | 6.00 | 3.50 | 0 | 0 | 0.132 | 2.038 | 0.010 | 4.038 | 0.399 | 0.417 |
| Example 2-22 | 6.08 | 3.54 | 0.010 | 0 | 0.120 | 2.083 | 0.020 | 4.083 | 0.441 | 0.399 |
| Example 2-23 | 6.43 | 3.71 | 0.050 | 0 | 0.102 | 2.000 | 0 | 4.000 | 0.270 | 0.305 |
| Example 2-24 | 7.00 | 4.00 | 0.100 | 0 | 0.102 | 2.000 | 0 | 4.000 | 0.285 | 0.325 |
| Comparative Example 2-2 | 49.80 | 20.00 | 0.362 | 0 | 0.020 | 2.540 | 0.119 | 4.540 | 0.483 | 0.392 |
| Comparative Example 2-3 | 48.10 | 20.00 | 0.324 | 0 | 0.020 | 2.455 | 0.102 | 4.455 | 0.482 | 0.404 |

Note:
M = $Ba_{0.1}Sr_{0.8}Ca_{0.1}$

Examples 3-1 to 3-3

As raw materials for host material, $SrCO_3$, MgO, $SiO_2$, SrS and ZnO were weighed as indicated in Table 7, at the same time, $EuF_3$ as raw material for activator was weighed to be 0.47 mol % with respect to the previous Sr, and this $EuF_3$ together with the previous raw materials for host material was mixed with a paint shaker for 90 minutes using φ3 mm zirconia ball for the media.

Next, the mixed powder and the media were separated with a 100 μm sieve, and a phosphor was obtained by firing at 1300° C. for six hours in a reducing gas atmosphere constituted by nitrogen and hydrogen.

TABLE 7

| | $SrCO_3$ | MgO | $SiO_2$ | ZnO | SrS |
|---|---|---|---|---|---|
| Example 3-1 | 195 | 25 | 125 | 10 | 10 |
| Example 3-2 | 190 | 20 | 130 | 20 | 10 |
| Example 3-3 | 185 | 15 | 135 | 30 | 10 |

The unit is mol.

Eu concentration was 0.5 mol % with respect to the concentration of Sr

As a result from the identification of formation phases by the X-ray diffractometer (XRD), X-ray fluorescence analysis (XRF) and ICP spectrophotometry, the obtained phosphor was shown to be a phosphor comprising an $Sr_3MgSi_2O_8$ phase, an $Sr_2SiO_4$ phase, an SrS phase and an $Sr_2ZnSi_2O_7$ phase, and represented by the formulae $(SrO_{1-\alpha}S_\alpha)_x \cdot (Mg_{1-\beta}Zn_\beta O)_y \cdot (SiO_2)_z:Eu^{2+}$ and $Sr_aS_bMg_cZn_dSi_eO_f:Eu^{2+}$ as shown in Table 8.

TABLE 8

| | $(SrO_{1-\alpha}S_\alpha)x$—$(Mg_{1-\beta}Zn_\beta O)y$—$(SiO_2)z:Eu^{2+}$ | | | | $Sr_aS_bMg_cZn_dSi_eO_f:Eu^{2+}$ (range when e = 1) | | | | |
|---|---|---|---|---|---|---|---|---|---|
| | x/y | z/y | α | β | (c + d)/(a + c + d) | a + c + d | b/(b + f) | b + f | CIEx | CIEy |
| Example 3-1 | 5.86 | 3.57 | 0.100 | 0.10 | 0.140 | 2.000 | 0.020 | 4.000 | 0.429 | 0.391 |
| Example 3-2 | 5.00 | 3.25 | 0.100 | 0.200 | 0.160 | 1.923 | 0.020 | 3.923 | 0.432 | 0.428 |
| Example 3-3 | 4.33 | 3.00 | 0.100 | 0.30 | 0.180 | 1.852 | 0.019 | 3.852 | 0.435 | 0.465 |

Comparative Example 4

As raw materials for host material, $SrCO_3$, MgO and $SiO_2$ were weighed so as to obtain a molar ratio of 300:100:200, at the same time, $EuF_3$ as raw material for activator was weighed to be 0.67 mol % with respect to the previous Sr, and this $EuF_3$ together with the previous raw materials for host material was mixed with a paint shaker for 90 minutes using φ3 mm zirconia ball for the media. Next, the mixed powder and the media were separated with a 100 μm sieve, and phosphor A represented by the formula $Sr_3MgSi_2O_8:Eu^{2+}$ was obtained by firing at 1300° C. for six hours in a reducing gas atmosphere constituted by nitrogen and hydrogen.

In addition, as raw materials for host material, $SrCO_3$ and $SiO_2$ were weighed so as to obtain a molar ratio of 200:100, at the same time, $EuF_3$ as raw material for activator was weighed to be 0.45 mol % with respect to the previous Sr, and this $EuF_3$ together with the previous raw materials for host material was mixed with a paint shaker for 90 minutes using φ3 mm zirconia ball for the media. Next, the mixed powder and the media were separated with a 100 μm sieve, and phosphor B represented by the formula $Sr_2SiO_4:Eu^{2+}$ was obtained by firing at 1300° C. for six hours in a reducing gas atmosphere constituted by nitrogen and hydrogen.

Phosphor A and phosphor B were mixed to obtain phosphor C.

In addition, the obtained phosphor C was mixed with a paint shaker for 30 minutes using φ3 mm zirconia ball for the media.

Next, the mixed powder and the media were separated with a 100 μm sieve, and firing at 1300° C. for six hours in a reducing gas atmosphere constituted by nitrogen and hydrogen was carried out.

(Discussion)

The following was found from the results of Table 1 to Table 8 and FIG. 1 to FIG. 8.

The phosphors obtained in the examples above were all emitting light by light excitation at wavelengths of 250 nm to 480 nm, and, had light-emission peaks at least in the wavelength regions 460 nm±30 nm and 580 nm±30 nm by light excitation at a wavelength of 400 nm, and, the luminescence color was white light represented by the CIE chromaticity coordinates x=0.25 to 0.53 and y=0.25 to 0.50, and depending on the composition, it was white light represented by x=0.28 to 0.45 and y=0.25 to 0.43.

Figure 6:
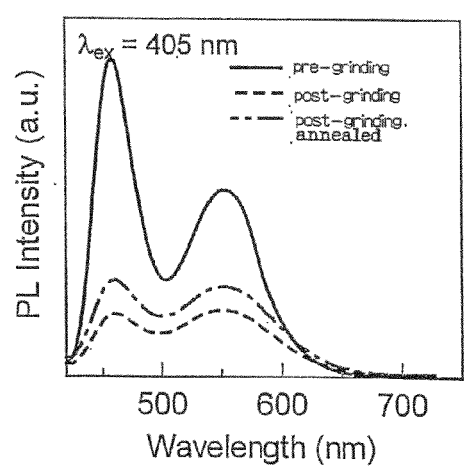
FIG. 6 is a PL spectrum of the phosphor obtained in Comparative Example 4 ("pre-milling" in the figure), a phosphor after this was mixed for 30 minutes with a paint shaker ("post-milling" in the figure), and further heat treated for phosphor ("post-milling annealed" in the figure)
Figure 7:
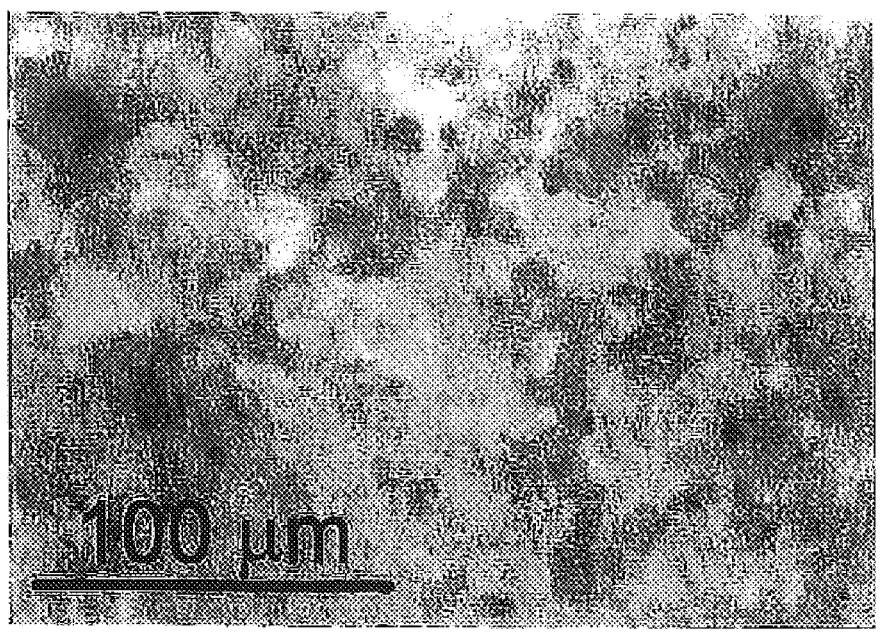
FIG. 7 is an electron micrograph (300-fold) during light-emission of the phosphor obtained in Example 1-1.
Figure 8:
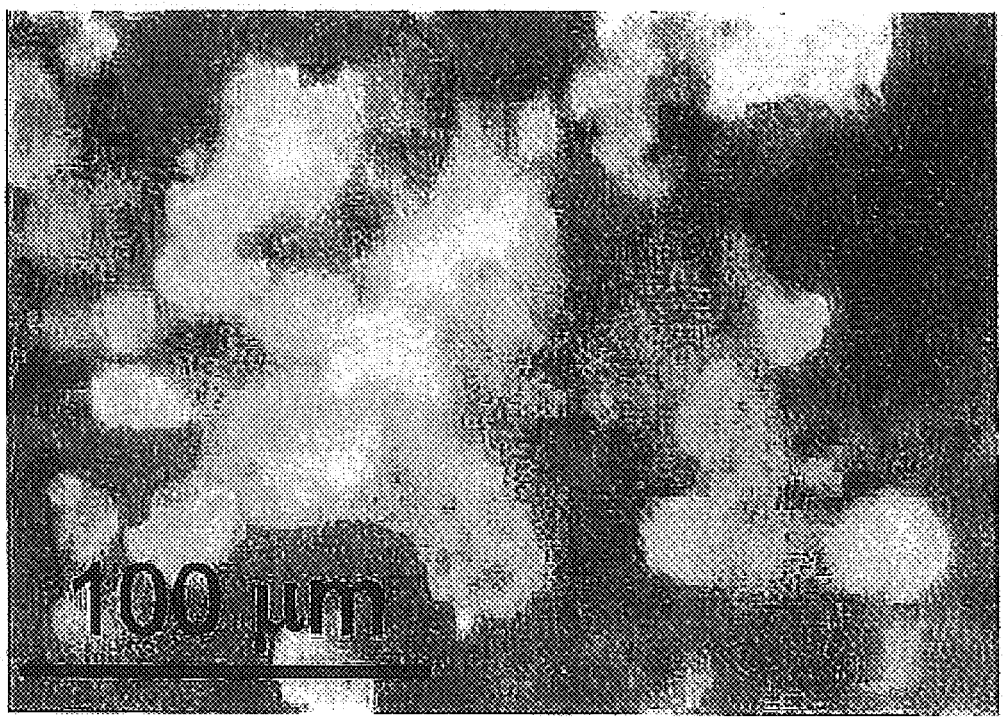
FIG. 8 is an electron micrograph (300-fold) during light-emission of phosphor C obtained in Comparative Example 4.
Figure 9:
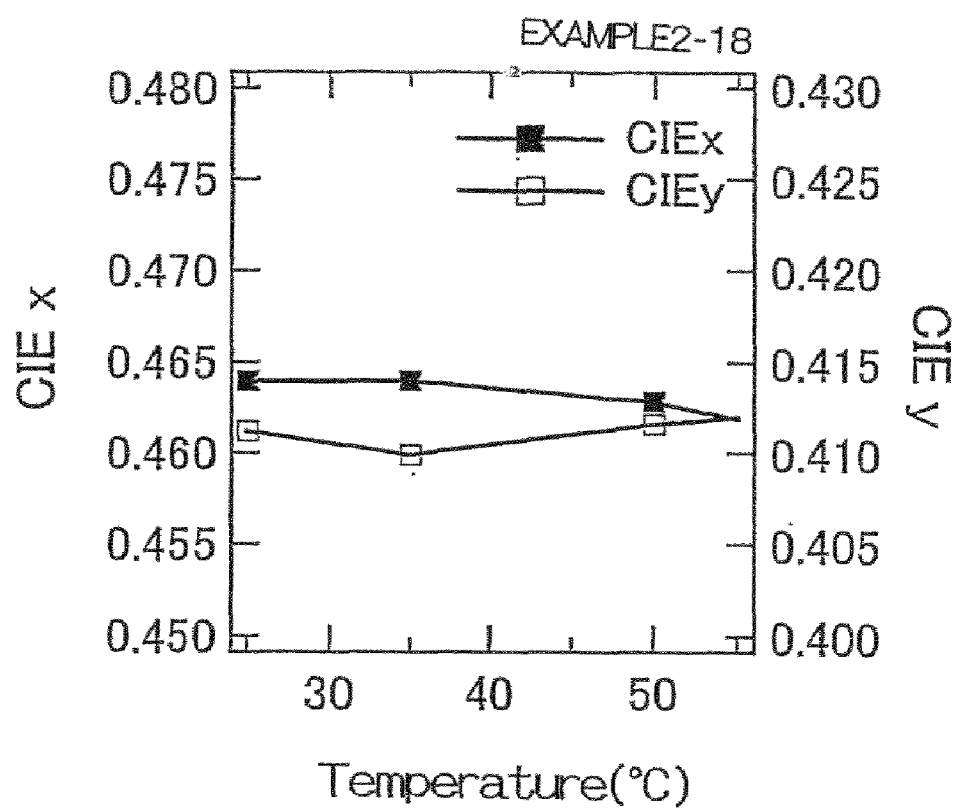
FIG. 9 is a graph showing color variation accompanying temperature elevation of the phosphor obtained in Example 2-18.
Figure 10:
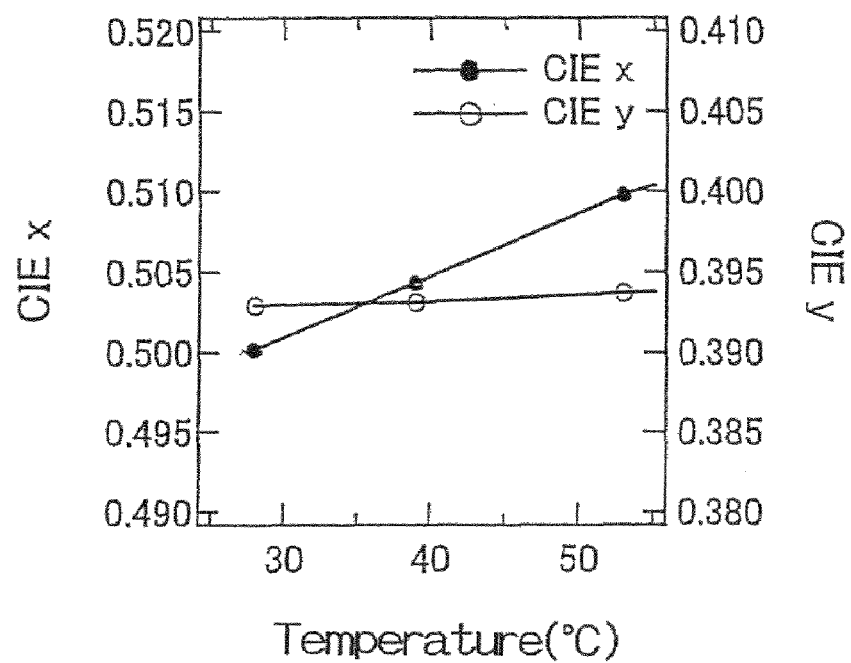
FIG. 10 is a graph showing color variation accompanying temperature elevation of the phosphor obtained Comparative Example 5.

In contrast, although the white phosphor of Comparative Example 4 had light-emission peaks at least in the wavelength regions 460 nm±30 nm and 580 nm±30 nm by excitation at a wavelength of 400 nm similarly to Example 1-3, according to fluorescence microscope observation, the white phosphor of Comparative Example 4 had heterogeneous color dispersion due to having larger particle diameter and not being dispersed homogeneously compared to the white phosphor of Example 1-3. To bring particle diameter to be the same as Example 1-3 and homogeneously disperse the Comparative Example 4, milling processing must be carried out. If a milling processing is carried out, the process obviously becomes complex, and as shown in FIG. 6, light emission intensity decreased to half or less, the color balance also collapses, and white light-emission was no longer be obtained. The light emission intensity did not improve even by heat processing (annealing).

<Measurement of Color Variation Accompanying Temperature Increase>

With the phosphor obtained in Example 2-18 and the phosphor obtained in the following Comparative Example 5 $(Ba_{1.173}Ca_{0.391}Mg_{0.198}Eu_{0.2}Mn_{0.04}SiO_4)$ serving as measurement samples, color variation accompanying temperature increase was measured.

Concretely, using a temperature regulator while controlling the temperature using a Pelletier chip, the measurement samples were heated so that the temperature increased at a speed of 1° C./second, and simultaneously, the PL spectra and color variations of the samples were measured using a spectrofluorometer.

Comparative Example 5

Example 2 from the a previously described Patent Reference 3 (Japanese Patent Application Laid-open No. 2005-226069) was traced to obtain a phosphor $(Ba_{1.173}Ca_{0.391}Mg_{0.198}Eu_{0.2}Mn_{0.04}SiO_4)$.

As a result, in contrast to the phosphor of the Comparative Example 5, which had a large color variation accompanying temperature increase, in particular, having red-shifted due to an increased x value, the phosphor of Example 2-18 was found to have a remarkably small color variation accompanying temperature increase. Note that, although the results of the measurements were shown for Example 2-18 as one example among the examples, examples other than Example 2-18 were measured similarly, and all were found to have remarkably small color variations accompanying temperature increase compared to Comparative Example 5.

The invention claimed is:

1. A white phosphor represented by the formula $Sr_aS_bMg_cZn_dSi_eO_f:Eu^{2+}$ with the proviso that when e=1, 0<(c+d)/(a+c+d)≦0.2, 1.8≦a+c+d≦2.2, 0≦b/(b+f)≦0.07 and 3.0≦b+f≦4.4.

2. The white phosphor as recited in claim 1 represented by the composition formula $(SrO_{1-\alpha}S_\alpha)_x \cdot (Mg_{1-\beta}Zn_\beta O)_y \cdot (SiO_2)_z:Eu^{2+}$ in the formula, 4.5≦x/y≦27.5, 3≦z/y≦14.5, $0 \leq \alpha \leq 0.3$ and, $0 \leq \beta \leq 0.7$, $\alpha$ representing concentration of S and $\beta$ representing concentration of Zn.

3. A white phosphor represented by the formula $Sr_aS_bMg_cZn_dSi_eO_f:Eu^{2+}$ with the proviso that when $e=1$, $0<(c+d)/(a+c+d) \leq 0.2$, $1.8 \leq a+c+d \leq 2.2$, $0 \leq b/(b+f) \leq 0.05$ and $3.5 \leq b+f \leq 4.2$.

4. The white phosphor as recited in claim 3 represented by the composition formula $(SrO_{1-\alpha}S_\alpha)_x \cdot (Mg_{1-\beta}Zn_\beta O)_y \cdot (SiO)_z:Eu^{2+}$ in the formula, $5 \leq x/y \leq 11$, $3 \leq z/y \leq 6$, $0 \leq \alpha \leq 0.1$ and, $0 \leq \beta \leq 0.5$, $\alpha$ representing concentration of S and $\beta$ representing concentration of Zn.

5. The white phosphor as recited in claim 1, emitting a white light represented by the CIE chromaticity coordinates x=0.25 to 0.53 and y=0.25 to 0.50.

6. The white phosphor as recited in claim 3, emitting a white light represented by the CIE chromaticity coordinates x=0.28 to 0.45, y=0.25 to 0.43.

7. The white phosphor as recited in claim 1, wherein the concentration in $Eu^{2+}$ is 0.1 to 5 mol % of the concentration in Sr.

8. The white phosphor as recited in claim 1, obtained by mixing an SrO raw material, an MgO raw material, an $SiO_2$ raw material, an $Eu^{2+}$ raw material, as necessary, an S raw material, and as necessary, a Zn raw material, and firing in a reducing atmosphere at 1000 to 1400° C.

9. The white phosphor as recited in claim 1, emitting white light by light excitation at a wavelength of 250 nm to 480 nm.

10. The white phosphor as recited claim 1, having light-emission peaks at least in the wavelength regions of 460 nm±30 nm and 580 nm±30 nm by light excitation at a wavelength of 400 nm.

11. The white phosphor as recited in claim 1, wherein a portion of Sr is substituted by either or both of Ca and Ba.

12. A white light-emitting equipment or device provided with a light emitter generating light at a wavelength of 250 nm to 480 nm and the white phosphor as recited in claim 1.

* * * * *